United States Patent
Bittner et al.

(10) Patent No.: US 8,754,698 B2
(45) Date of Patent: Jun. 17, 2014

(54) CIRCUIT AND METHOD FOR SIGNAL VOLTAGE TRANSMISSION WITHIN A DRIVER OF A POWER SEMICONDUCTOR SWITCH

(75) Inventors: Roland Bittner, Stegaurach (DE); Rene Hopperdietzel, Nürnberg (DE); Alexander Suchan, Nürnberg (DE)

(73) Assignee: Semikron Elektronik GmbH & Co. KG, Nürnberg (DE)

( * ) Notice: Subject to any disclaimer, the term of this patent is extended or adjusted under 35 U.S.C. 154(b) by 0 days.

(21) Appl. No.: 12/396,279

(22) Filed: Mar. 2, 2009

(65) Prior Publication Data

US 2009/0224816 A1  Sep. 10, 2009

(30) Foreign Application Priority Data

Feb. 28, 2008  (DE) .......................... 10 2008 011 603

(51) Int. Cl.
*H03L 5/00*  (2006.01)

(52) U.S. Cl.
USPC .......................................... 327/333; 327/109

(58) Field of Classification Search
USPC ......... 327/306, 333, 100–103, 538–544, 109; 326/62, 63, 80–81
See application file for complete search history.

(56) References Cited

U.S. PATENT DOCUMENTS

| | | | | |
|---|---|---|---|---|
| 5,061,863 A | * | 10/1991 | Mori et al. | 327/50 |
| 5,335,271 A | * | 8/1994 | Takato et al. | 379/382 |
| 6,664,861 B2 | * | 12/2003 | Murakami | 331/57 |
| 6,897,717 B1 | * | 5/2005 | Eddleman et al. | 327/543 |
| 7,006,159 B2 | * | 2/2006 | Kuehn | 348/707 |
| 7,135,913 B2 | * | 11/2006 | Min et al. | 327/541 |
| 2001/0045845 A1 | | 11/2001 | Oshio | |
| 2003/0012040 A1 | | 1/2003 | Orita et al. | |
| 2003/0020444 A1 | * | 1/2003 | Kamenicky | 323/315 |
| 2005/0057871 A1 | | 3/2005 | Engelen et al. | |
| 2009/0224816 A1 | | 9/2009 | Bittner et al. | |

FOREIGN PATENT DOCUMENTS

DE   10 2008 011 603   9/2009

\* cited by examiner

*Primary Examiner* — Dinh T. Le
(74) *Attorney, Agent, or Firm* — The Law Office of Roger S. Thompson

(57) ABSTRACT

A circuit for signal voltage transmission within a driver contains, on its primary side, a signal input for a first signal voltage, a current source for a current correlated with the first signal voltage, a connecting line for the current, the connecting line leading from the current source to the secondary side of the driver, and, on the secondary side, a current-voltage converter for converting the current into a second signal voltage correlated with the current, and a signal output for the second signal voltage. On the primary side, the first signal voltage is applied to the signal input, the current source generates a current correlated with the signal voltage, and the current passes to the secondary side via the connecting line. On the secondary side, the current-voltage converter converts the current into the second signal voltage and the second signal voltage is output at the signal output.

17 Claims, 3 Drawing Sheets

CIRCUIT AND METHOD FOR SIGNAL VOLTAGE TRANSMISSION WITHIN A DRIVER OF A POWER SEMICONDUCTOR SWITCH

BACKGROUND OF THE INVENTION

1. Field of the Invention

The invention is directed to a circuit and a method for signal voltage transmission within a driver of a power semiconductor switch.

2. Description of the Related Art

A power semiconductor switch requires a so-called driver. The driver has a primary side and a secondary side separated from the primary side with regard to its electrical potential. On the primary side, a signal voltage in the form of a switch-on/off signal for the power semiconductor switch is fed into the driver, e.g., by a standard 5 V logic circuit having, e.g., the installation ground as reference potential together with the primary side.

With their reference potential, the secondary side and thus the semiconductor switch, are at the potential of the power semiconductor switch, e.g., 10 V above the installation ground. During the switching operation of the semiconductor switch, in particular, the reference potential of the secondary side and of the semiconductor switch can fluctuate greatly upward or downward. Consequently, there is a potential difference between the primary side and the secondary side. In the case of power semiconductor switches of low power classes which are used in forklift trucks, for example, the maximum potential difference between the primary side and the secondary side is in this case around 200 V.

For directly driving the semiconductor switch, a more powerful and switching voltage is available on the secondary side than is available on the primary side. The switching signal or the switching voltage therefore has to be transmitted, and if appropriately amplified or modified, within the driver from the primary side to the secondary side, that is to say across the potential limit. Various solutions are known for this purpose.

The direct transmission of the driving power by a power pulse by means of a transformer is known, that is to say that the switching signal per se is transmitted from the primary side to the secondary side by means of a transformer. In this case, the secondary-side switching input, e.g., the gate of the power semiconductor switch, is connected, e.g., directly to the transformer output.

The transformer-based transmission of driving pulses in conjunction with a secondary-side edge storage unit is also known. This involves a pulse having a different polarity being generated from a primary-side logic signal having the switching states Hi and Lo, e.g., by means of a capacitor as differentiator for each state change of the signal (Hi-Lo or Lo-Hi). The pulse is transmitted from the primary side to the secondary side by means of an RF transformer. Situated on the secondary side there is an edge storage unit, e.g., in the form of a flip-flop, which is set by pulses of one polarity and cleared by those of the other polarity, and thus provides a logic signal corresponding to the input signal. In this case, therefore, rather than the switching signal per se, only the state change of that signal is transmitted by means of the transformer and the switching state, that is to say on or off, of the power semiconductor switch is stored in the secondary-side edge storage unit.

The capacitive transmission of pulses with an output-side edge storage unit is also known. This involves a current pulse having a different polarity being generated from the abovementioned logic signal for the respective state change thereof. The pulse is transmitted from the primary side to the secondary side by means of the capacitor. The edge storage unit mentioned is driven in a manner corresponding to that above by means of the current pulses or the respective voltage drop generated at a resistor by said pulses.

Finally, the transmission of voltage and/or current pulses with a secondary-side flip-flop storage unit is known, which involves generating a current pulse from the abovementioned logic signal, which current pulse is transmitted to the secondary side by means of a high-voltage transistor and again drives, e.g., the above-mentioned flip-flop there.

It is also known to code switching pulses, e.g., with the aid of a frequency coding, and to decode them on the secondary or output side. In this case, pulses having, e.g., a different frequency are generated from the logic signal mentioned, depending on the logic state or state change of the signal, by means of a coding unit. The transmission of the pulses to the output side is once again effected by means of an RF transformer. A decoding logic is then once again situated on the secondary side, which decoding logic is set and reset by the pulses having, e.g., a different frequency and thus once again provides the above-mentioned output signal.

The known solutions all have disadvantages. Transformer-based forms of transmission require large inductive components that are usually afflicted with large value tolerances. What is common to all of the pulse transmission methods is that an erroneous transmission of a pulse, e.g., as a result of interference during the pulse transmission, can lead to an incorrect switching state of the power semiconductor switch for the entire clock duration, that is to say until the next pulse arrives. Secondary-side state storage units, such as, e.g., edge storage units or flip-flops, always involve the risk that, as a result of brief interference, both during the driving of such state storage units and in the state storage unit itself, a longer-term erroneous switching state of the power semiconductor switch arises until the state storage unit is switched into the correct switching state again by a correct pulse or correct information.

SUMMARY OF THE INVENTION

It is an object of the invention to provide an improved circuit and an improved method for signal voltage transmission within a driver of a power semiconductor switch.

With regard to the circuit, the object is achieved by means of a circuit which enables signal voltage transmission within a driver of a power semiconductor switch. The circuit contains a signal input for a first signal voltage, that is to say for the switching signal fed into the driver or the primary side thereof by the above-mentioned driving logic. The signal input is arranged on the primary side of the driver, the primary side having a first reference potential. In other words, the electronic components built in on the primary side are referred to this reference potential, e.g., the apparatus ground of an entire switching module or of the installation into which the driver is incorporated.

The circuit furthermore comprises a current source likewise arranged on the primary side of the driver. The current source serves for generating a current, the latter or the current intensity thereof being correlated with the first signal voltage, that is the voltage value thereof. On account of the correlation, therefore, the current generated by the current source carries the information content of the signal voltage; e.g., in the simplest case, a defined current flows if a signal voltage is present, and no current flows if no signal voltage is present.

The circuit additionally comprises a connecting line leading from the primary side to the secondary side of the driver.

In this case, the secondary side of the driver has a second reference potential, which is generally different from the first. The connecting line therefore bridges the potential difference or potential limit between the primary side and the secondary side. On the primary side, the connecting line is connected to the current source and therefore carries the current respectively generated by the current source, said current then flowing equally through the primary side and the secondary side. By way of the current intensity, therefore, the information of the first signal voltage is transported to the secondary side.

The circuit furthermore contains a current-voltage converter, which is arranged on the secondary side and is likewise connected to the connecting line and through which the current from the current source thus flows. The current-voltage converter converts the current into a second signal voltage, which is in turn correlated with the current and thus with the first signal voltage. Finally, the circuit comprises a signal output on the secondary side of the driver, at which signal output the second signal voltage is output for forwarding to the semiconductor switch.

In other words, therefore, according to the invention, within the driver, a signal voltage is transmitted from the primary side to the secondary side in such a way that, on the primary side, the first signal voltage is converted into a current that is transported across the potential limit to the secondary side, where it is converted back into a second signal voltage, which is dependent on the first.

The circuit according to the invention permits interference-immune signal transmission across potential limits. The circuit can also be realized with few components and is therefore simple and cost-effective.

The primary-side current source can be a current sink, in particular, that can also enable or generate a current flow controlled in a targeted manner from the secondary side to the primary side, which is appropriate due to the potential difference that generally drops from the secondary side to the primary side.

In one advantageous configuration of the circuit, the current source is connected to the connecting line by one of its sides and to the first reference potential of the primary side by its other side, i.e., the side remote from the connecting line. The current source thus brings about a current flow towards the reference potential of the primary side or from said reference potential. Particularly if the potentials of the secondary side are higher than the reference potential of the primary side, the current source therefore has available the maximum available potential difference for driving a current.

In a further advantageous configuration, the signal input of the primary side is referred to the first reference potential. This generally facilitates connection to an external control logic since the latter generally has the same reference potential as the primary side. The first signal voltage can thus be fed directly into the driver.

In particular, an especially simple embodiment of the invention arises if both the current source and the signal input are referred to the reference potential. In a further preferred embodiment it is then possible, namely, for the current source to be a generally three-pole, controlled current source which is controlled by the signal voltage and directly has the signal input. Such a current source can, e.g., easily be realized as a transistor current source which has a resistor as negative feedback, for example, and thus converts the first signal voltage directly into the current.

Such a transistor current source can additionally be supplemented by a base-side RC filter and/or a clamping diode in order to bring about an input-side low-pass filtering of the signal voltage and/or an overvoltage protection etc.

In a further preferred embodiment, the current source is a voltage-proof current source which can be loaded with at least the maximum voltage difference between the primary side and the secondary side. Consequently, the current source undertakes the isolation or the absorbing of the potential difference between the primary side and the secondary side. Other precautions for overcoming the potential between the primary side and the secondary side therefore need not be taken.

A particularly simple embodiment of a voltage-proof current source arises if the current source contains a voltage-proof high-voltage transistor connected to the connecting line. The potential protection between the primary side and the secondary side is therefore accomplished by this one component.

In a further preferred embodiment, the connecting line is assigned a polarity reversal protection acting between the primary side and the secondary side and/or a current limiter acting between the two sides. The polarity reversal protection ensures, e.g., that no current can flow in a forbidden direction through the current source or the current-voltage converter. The current limiter, in the case of correspondingly large potential differences between the primary side and the secondary side, provides for limiting the maximum permissible current flowing in the connecting line and thus through the current source and current-voltage converter. These two components of the circuit are therefore protected.

In a further preferred embodiment, the polarity reversal protection is a diode arranged in the connecting line and/or the current limiter is a resistor arranged therein.

The current limiting resistor and/or the polarity reversal protection diode therefore attenuate the parasitic effects of rapid potential shifts between the primary side and the secondary side.

In a further preferred embodiment of the circuit, the current-voltage converter is connected to the supply voltage of the secondary side by its side remote from the connecting line. In other words, the current flows from the connecting line through the current-voltage converter and thus to the supply voltage of the secondary side. Consequently, the corresponding advantages, such as when the current source is connected to the reference potential of the primary side, arise on the secondary side, namely a maximum possible voltage difference between the respective ends of the path for the current, particularly if the current flows from the secondary side to the primary side or the supply voltage of the secondary side has a maximum potential with respect to the reference potential of the primary side.

In a further preferred embodiment, the signal output of the secondary side is referred to the second reference potential. The second signal voltage can therefore be simply fed, analogously to the first, into a further processing logic of the secondary side without potential conversion.

In conjunction with a current-voltage converter connected to the supply voltage of the secondary side, however, it is necessary in this case to convert the current or the voltage obtainable therefrom, which are then generally referred to the supply voltage, into the second signal voltage, referred to the reference potential.

In one advantageous configuration, therefore, the current-voltage converter contains a current mirror which mirrors the current coming from the connecting line transformer into a mirror current, that is to say into a further current correlated with the original current, which is then to be converted in turn into the second signal voltage. In an exemplary configuration of this type, the current transmitted from the primary side to the secondary side then flows from the supply voltage of the secondary side through the current mirror, the connecting line and the current source to the reference potential of the primary side. The mirror current flows from the supply voltage of the secondary side to the reference potential of the secondary side. The mirror current itself can then easily be converted into a second signal voltage, referred to the reference potential of the secondary side.

The current mirror can be a transistor current mirror, which can contain, for example, additional resistors as emitter negative feedback for current limiting.

In order to realize a particularly simple current-voltage conversion for the second signal voltage, the current-voltage converter can contain a resistor that converts the current into the second signal voltage.

For a circuit according to the invention it may also be desirable to suppress signal changes, that is to say changes in the signal voltage at temporal intervals that are significantly shorter than the typical switching times. Such momentary signal fluctuations can arise, e.g., as a result of fluctuations of the first signal voltage, fluctuations of the current on account of the voltage drift of the secondary side, or the like. In a further preferred embodiment, therefore, the circuit contains an attenuation element for the second signal voltage, which attenuation element serves merely, for example, for cushioning current fluctuations which are uncorrelated with the first signal voltage, that is to say they arise, for example, as a result of the abovementioned potential drift. Corresponding attenuation elements are, e.g., low-pass filters that are assigned to the current source, the connecting line, the optional current mirror or the current-voltage converter.

If the corresponding filter elements for attenuating parasitic effects are correspondingly reduced or decreased in terms of their time constants, the circuit according to the invention is also suitable for the transmission of a fast data transmission protocol alongside the transmission of comparatively slow signals for switching the power semiconductor switch. Consequently, alongside switching signals, other signals, e.g., extensive information such as control signals or program code can also be transmitted from the primary side to the secondary side of the driver by the signal voltages.

In a particularly preferred embodiment, the attenuation element is a capacitor at which a second signal voltage is present. In other words, the signal output on the secondary side is provided with a capacitor.

The second signal voltage is therefore filtered by the capacitor connected in parallel with the signal output, thus resulting in a calculable minimum switched-on duration for the power semiconductor switch, that is to say short pulse suppression and overall an increased interference immunity of the circuit.

In a further preferred embodiment, the circuit contains in each case two current sources and two connecting lines between signal input and current-voltage converter. A respective current source and a connecting line together thus form a separate signal or current path between the signal input and the current-voltage converter. One signal path is used if the reference potential of the secondary side is higher than that of the primary side. The current then flows from the secondary side to the primary side, although the information is transported in the opposite direction. The other signal path is used when the reference potential of the secondary side is lower than that of the primary side. The current then flows from the primary side to the secondary side, that is to say in the same direction in which the information is transported.

Consequently, a second signal path between primary side and secondary side is therefore made available for the circuit according to the invention, which second signal path has a complementary current direction with respect to the first signal path and can therefore carry a physically complementary signal. In this case, the two signal paths are logically connected in such a way that external influences, such as a secondary-side potential fluctuation, for example, which brings this from above to below the primary-side reference potential. Such a fluctuation then no longer leads to the chopping of the physical current flow and an associated corruption of the output signal, but rather to the current flow switching to the alternative current path, so the logical signal flow from the primary side to the secondary side are correctly maintained.

With regard to the method, the object is achieved by means of the method for signal voltage transmission within a driver of a power semiconductor switch comprising the following steps: the first signal voltage is applied to the abovementioned signal input of the primary side of the driver, the first current source generates a current correlated with the signal voltage, the connecting line carries the current from the primary side to the secondary side, the current-voltage converter converts the current into a second signal voltage and the latter is output at the signal output.

The advantages of the method according to the invention have already been explained in connection with the circuit according to the invention.

As already mentioned, in one preferred embodiment of the method, the current flows from the supply voltage of the secondary side to the reference potential of the primary side.

As likewise mentioned, in a further preferred embodiment of the method, the current arriving on the secondary side is translated into a mirror current correlated with the arriving current by a current mirror and the mirror current is fed to the current-voltage converter instead of the actual current. The current-voltage converter then converts the mirror current into the second signal voltage.

As already mentioned, first and/or second signal voltage and/or the current can preferably also be subjected to low-pass filtering.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

For a further description of the invention, reference is made to the exemplary embodiments of the drawings, which, in each case is a basic schematic diagram.

DETAILED DESCRIPTION OF THE PRESENTLY PREFERRED EMBODIMENTS

Figure 1:
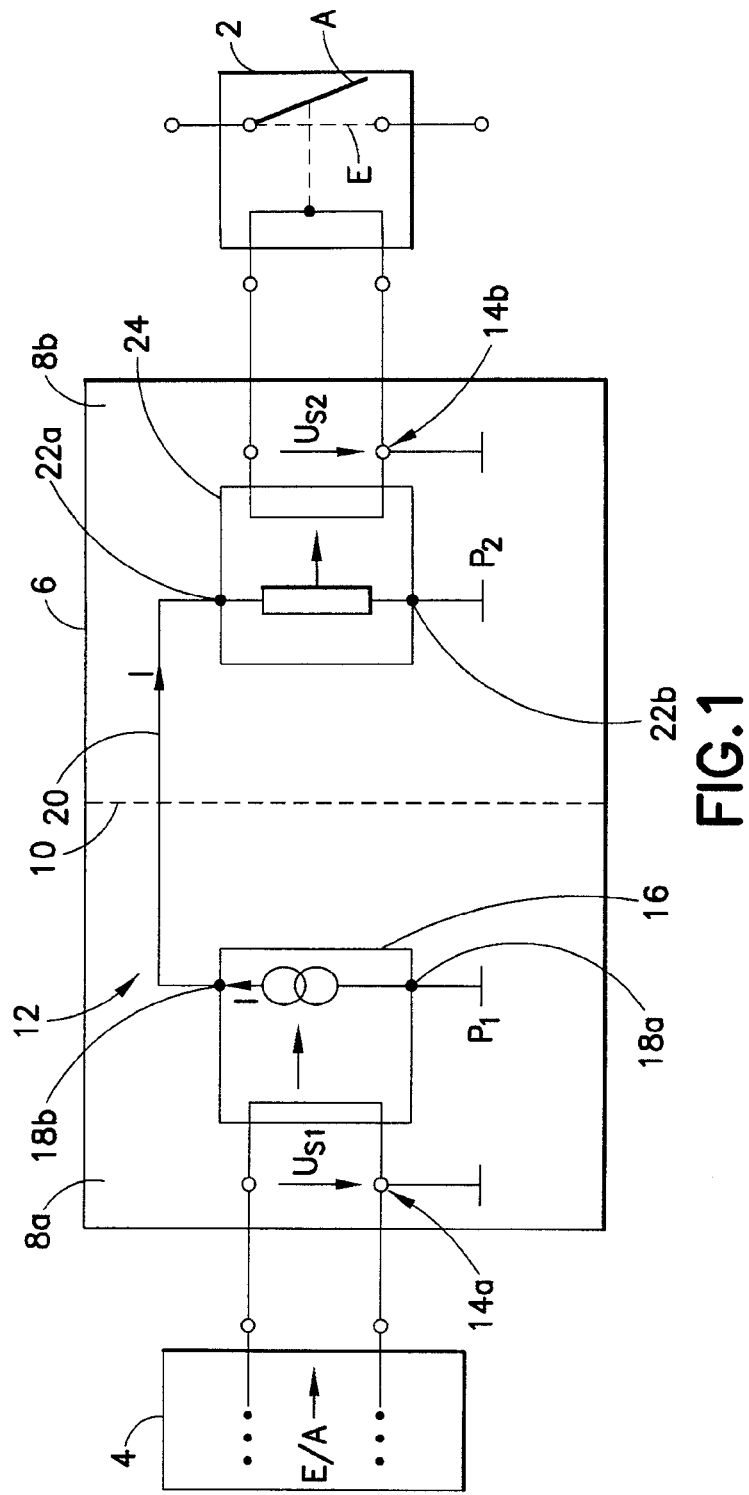
FIG. 1 shows the basic diagram of a circuit according to the invention with semiconductor switch and driving electronics with current flow to the secondary side.

FIG. 1 shows, a power semiconductor switch 2, the switching state "on" E and "off" A of which is predetermined by a logic circuit 4. For this purpose, logic circuit 4 generates a first signal voltage $U_{S1}$, which, however, is insufficient to drive switch 2 directly. This is because the latter requires a significantly greater signal voltage $U_{S2}$. In order to generate the signal voltage $U_{S2}$ from $U_{S1}$, therefore, a driver 6 is connected between logic circuit 4 and switch 2. Driver 6 has a primary side 8a facing logic circuit 4 and a secondary side 8b facing switch 2. Primary side 8a and secondary side 8b have potential differences, illustrated by a dashed line 10. By way of example, the primary side 8a has as ground a first reference potential $P_1$ and the secondary side 8b has a reference potential $P_2$.

Driver 6 contains a circuit 12 serving for the signal voltage transmission of the first signal voltage $U_{S1}$ coming from the logic circuit 4 and arriving on primary side 8a. Said signal voltage is output in the form of second signal voltage $U_{S2}$ to switch 2 on secondary side 8b. Circuit 12 comprises a two-pole signal input 14a, which is arranged on primary side 8a, and a current source 16, which generates a current I that is correlated with the signal voltage $U_{S1}$, e.g., is proportional thereto. Logic circuit 4 is connected to signal input 14a.

Current source 16 is connected to reference potential $P_1$ by its first current terminal 18a, which carries current I, and to a connecting line 20 by its second current terminal 18b, which carries current I, connecting line 20 leading from primary side 8a across the potential limit of line 10 to secondary side 8b. Connecting line 20 therefore transports current I to secondary side 8b.

On secondary side 8b, connecting line 20 is connected to a first current terminal 22a of a current-voltage converter 24, current I leaving current-voltage converter 24 at a current terminal 22b, which leads to reference potential $P_2$. Current-voltage converter 24 converts current I into a second signal voltage $U_{S2}$, which it makes available at a two-pole signal output 14b. Switch 2 is connected to signal output 14b.

In the discussion below, switch 2 is initially in the "off" position A, the signal voltages $U_{S1}$ and $U_{S2}$ are 0 V relative to the respective potentials $P_1$ and $P_2$, and the current I is 0 A.

For switching on switch 2, logic circuit 4 generates a voltage $U_{S1}$ of +5 V relative to reference potential $P_1$. Current source 16 thereupon supplies a current I of 1 mA, for example, which is converted in current-voltage converter 24 into a second signal voltage $U_{S2}$ of +15 V with respect to reference potential $P_2$, whereupon switch 2 switches to the "on" state E. In this case, reference potential $P_1$ is higher than reference potential $P_2$ by a voltage difference of 10 V, for which reason the current I flows from primary side 8a to secondary side 8b.

Figure 2:
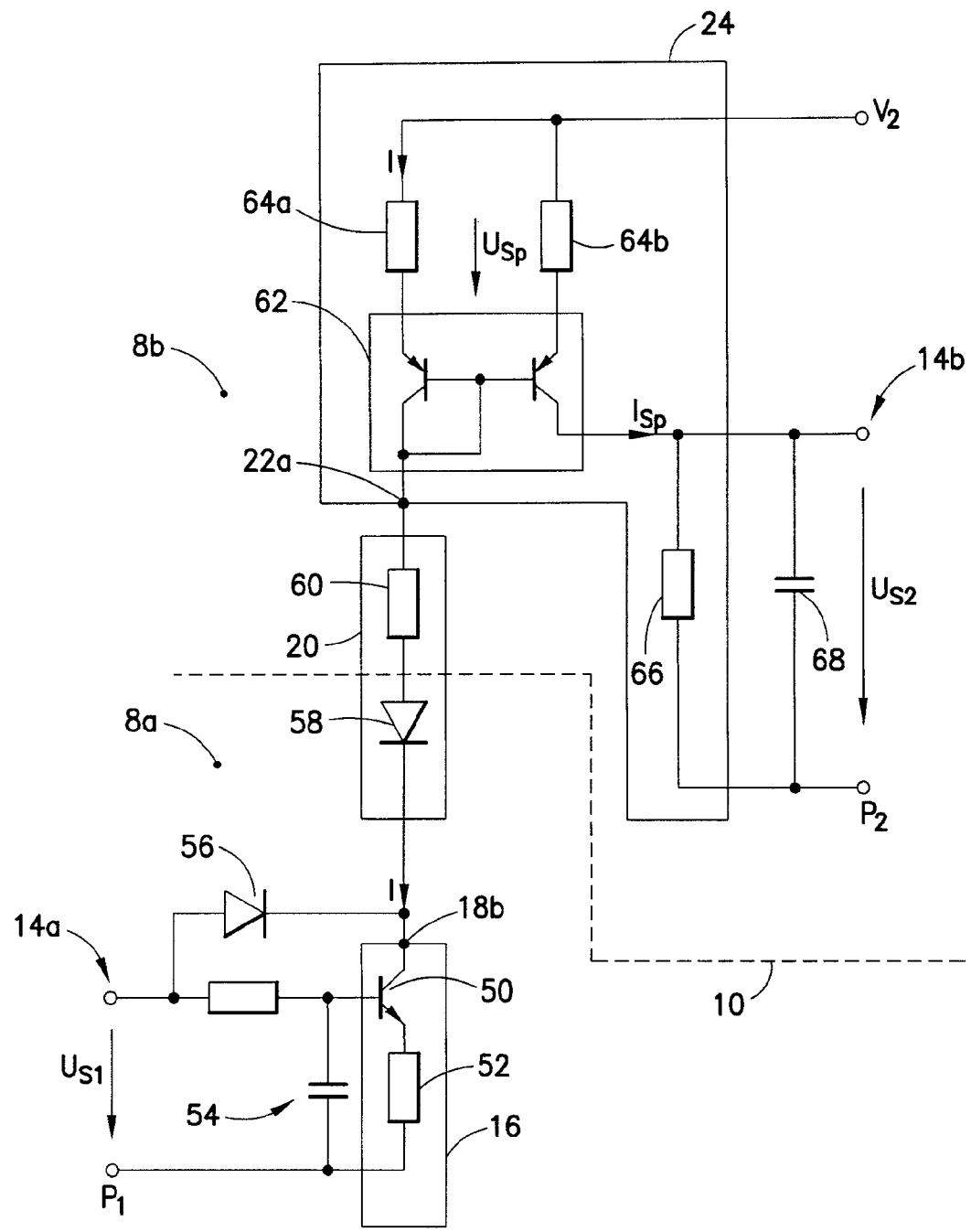
FIG. 2 shows a concrete exemplary embodiment of the circuit from FIG. 1 with current flow to the primary side.

FIG. 2 shows an alternative configuration of a circuit 12, in which the reference potential $P_2$ in regular operation is always higher than the reference potential $P_1$. In FIG. 2, current source 16 contains a high-voltage transistor 50, which is voltage-proof to withstand up to 200 V in the example and is therefore voltage-proof with respect to the maximum potential difference between reference potential $P_1$ and supply voltage $V_2$ of the secondary side 8b. Current source 16 additionally contains an emitter resistor 52, connected to the emitter of the high-voltage transistor 50, as emitter negative feedback. An RC filter 54 is additionally connected between the signal input 14a and current source 16. A clamping diode 56 connects the current terminal 18b to the signal-carrying input of signal input 14a.

Connecting line 20 likewise contains a clamping diode 58 and, as a current limiting resistor, a resistor 60 for limiting the current between secondary side 8b and primary side 8a. Owing to the given potential differences in the reference potentials $P_2$ and $P_1$ in FIG. 2, the current I flows from supply voltage $V_2$ of the secondary side 8b to reference potential $P_1$ of the primary side 8a.

In FIG. 2, the current-voltage converter 24 contains a current mirror 62, which is connected internally to a current terminal 22a; the current I is therefore passed internally via current mirror 62 and a mirror resistor 64a to the supply voltage $V_2$. In current-voltage converter 24, therefore, current I is firstly converted into a mirror voltage $U_{SP}$ at mirror resistor 64a. This mirror voltage is referred to the supply voltage $V_2$. In principle, the mirror voltage $U_{SP}$ could already be used as output voltage $U_{S2}$ if the latter is permitted to be referred to the supply voltage $V_2$ of secondary side 8b.

Although the mirror voltage $U_{SP}$ carries the logical switching signal for switch 2, the latter requires in the example, however, a switching voltage referred to the reference potential $P_2$. By means of current mirror 62 or a further mirror resistor 64b, therefore, the mirror voltage $U_{SP}$ is converted into a mirror current $I_{SP}$, which is fed instead of the original current I to a resistor 66, where it is finally converted into the signal voltage $U_{S2}$. Since resistor 66 is connected to the reference potential $P_2$, the signal voltage $U_{S2}$ is now likewise referred to this reference potential and can thus be used directly by switch 2. For the low-pass filtering of the signal voltage $U_{S2}$, a filter capacitor 68 is connected in parallel with resistor 66, the signal voltage $U_{S2}$ likewise being dropped across said capacitor.

In the embodiment FIG. 2, during the switching operation of the switch 2, even short voltage undershoots, that is to say fluctuations of the potential $P_2$ even below the potential $P_1$, are permitted as long as they do not fall below the reverse voltage of the diode 58. Even such undershoots are filtered out by the capacitor 68, such that the signal voltage $U_{S2}$ does not fall below or exceed that value at which the switch 2 would switch incorrectly.

Figure 3:
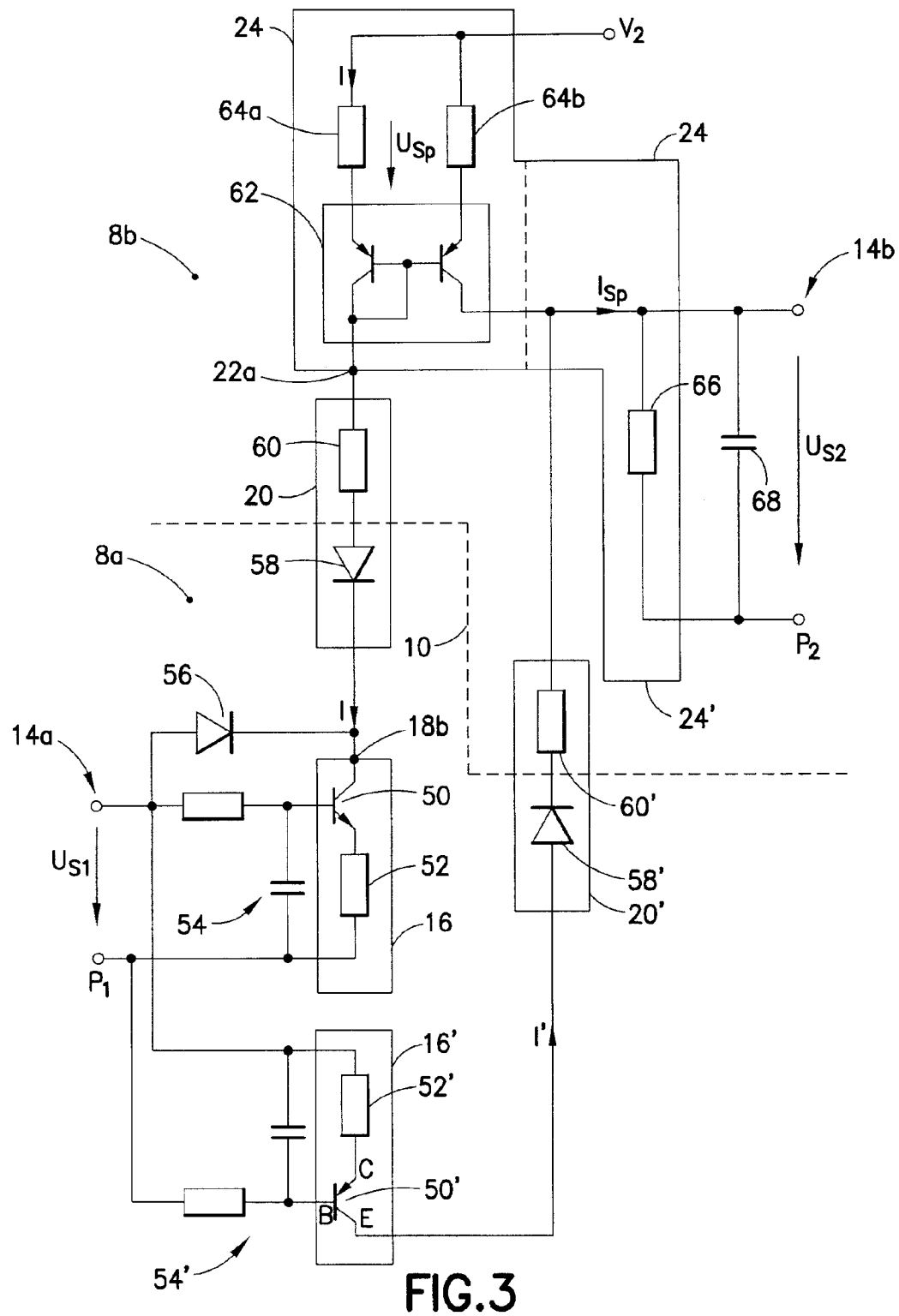
FIG. 3 shows an alternative embodiment to the circuit from FIG. 2 with a second alternative current path.

FIG. 3 shows how a second RC filter 54' is connected to signal input 14a in parallel with the RC filter 54. Said second RC filter is connected in a manner inverted with respect to the RC filter 54, namely that the resistor is situated in the lower line connected to the potential $P_1$. A corresponding high-voltage transistor 50' is also connected to the potential $P_1$ by its base B and to the RC element 54' by its collector C via a resistor 52', such that these form a current source 16'. The emitter E of a high-voltage transistor 50' is connected to resistor 60 via a diode 58', which is biased oppositely relative to diode 58, and a resistor 60'. Thus, FIG. 3 has a connecting line 20' which is complementary to connecting line 20 and which is likewise connected between signal input 14a and current-voltage converter 24', formed from resistor 66 and capacitor 68. Consequently, in the circuit in accordance with FIG. 3, a current I or I' can flow between primary side 8a and secondary side 8b optionally via connecting lines 20 or 20', depending on which of the reference potentials $P_1$ or $P_2$ is greater. In this case, the current path 20' bypasses current mirror 62, which is therefore not included in current-voltage converter 24' since the current flow I' is effected from potential $P_1$ on the primary side, and is therefore not required.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A circuit for signal voltage transmission within a driver of a power semiconductor switch, comprising:
    a signal input for a first signal voltage, said signal input being arranged on a primary side of the driver, the primary side of the driver having a first, non-zero, reference potential applied thereto;
    a first current source arranged on the primary side of the driver for generating a first current correlated with the first signal voltage;
    a second current source;
    a first connecting line for carrying said first current, said first connecting line being connected to said first current source and leading from the primary side of the driver to a secondary side thereof, the secondary side having a second reference potential applied thereto;
    a second connecting line;
    a current-voltage converter which is arranged on the secondary side of the driver and is connected to said first connecting line serves for converting said first current into a second signal voltage correlated with said first current;
    said current-voltage converter containing a current minor for converting said first current coming from said first connecting line into a second current to be converted into said second signal voltage; and
    a signal output for said second signal voltage, said signal output being arranged on the secondary side of the driver;
    wherein said second side is capable of generating said second reference potential at a potential which is either higher or lower than said first, non-zero, reference potential at different times;
    wherein each of said second current source and said second connecting line is disposed between said signal input and said current-voltage converter; and
    wherein said first current source provides for signal transmission along said first connecting line when said first reference potential is greater than said second reference potential and said second current source provides for signal transmission along said second connecting line when said first reference potential is less than said second reference potential; and
    whereby said second signal voltage may be transmitted over said secondary side of the driver.

2. The circuit of claim 1, wherein said first current source is connected to said first reference potential by its side remote from said connecting line.

3. The circuit of claim 1, wherein said signal input is referred to said first reference potential.

4. The circuit of claim 1, wherein said first current source is a controlled current source which is controlled by said first signal voltage and has the signal input applied thereto.

5. The circuit of claim 1, wherein said first current source is a current source which is voltage-proof to withstand at least the maximum voltage difference between the primary side and the secondary side of the driver.

6. The circuit of claim 5, wherein said first current source contains a voltage-proof high-voltage transistor connected to said first connecting line.

7. The circuit of claim 1, wherein said first connecting line has at least one of a polarity reversal protection and a current limiter acting between the primary side and the secondary side of the driver.

8. The circuit of claim 7, wherein said polarity reversal protection is a diode.

9. The circuit of claim 7, wherein said current limiter is a resistor in the connecting line.

10. The circuit of claim 1, wherein said current-voltage converter is connected to a supply voltage of the secondary side of the driver by its side remote from said first connecting line.

11. The circuit of claim 1, wherein said signal output is referred to said second reference potential.

12. The circuit of claim 1, wherein said current-voltage converter contains a resistor that converts said current into said second signal voltage.

13. The circuit of claim 1, further comprising an attenuation element coupled to said second signal voltage.

14. The circuit of claim 13, wherein said attenuation element is a capacitor at which the second signal voltage is present.

15. A method for signal voltage transmission within a driver of a power semiconductor switch, the method comprising the following steps:
    applying a first signal voltage to a signal input arranged on a primary side of the driver;
    applying a first, non-zero, reference potential to the primary side of the driver;
    generating a first current correlated with said signal voltage from a first current source on the primary side of the driver;
    transmitting said first current from the primary side of the driver to a secondary side thereof over a first connecting line connected to said first current source;
    applying a second reference potential higher than said first reference potential to said secondary side;
    converting said first current into a second signal voltage correlated with said first current on the secondary side of the driver at a current-voltage converter;
    generating a second current from a second current source and applying it to a second connecting line;
    translating the first current on the secondary side into a correlated mirror current;
    converting the mirror current into the second signal voltage; and
    outputting said second signal voltage at a signal output arranged on the secondary side of the driver;
    wherein each of said second current source and said second connecting line is disposed between said signal input and said current-voltage converter; and
    wherein said first current source provides for signal transmission along said first connecting line when said first reference potential is greater than said second reference potential and said second current source provides for signal transmission along said second connecting line when said first reference potential is less than said second reference potential;
    whereby said signal voltage may be transmitted over said secondary side of the driver.

16. The method of claim 15, wherein said current flows from a supply voltage of the secondary side of the driver to said first reference potential of the primary side of the driver.

17. The method of claim 15, further comprising the step of applying a low-pass filter to at least one of said first signal voltage, said second signal voltage and said current.

\* \* \* \* \*